(12) United States Patent
Whitlaw et al.

(10) Patent No.: US 7,695,605 B2
(45) Date of Patent: Apr. 13, 2010

(54) TIN PLATING METHOD

(75) Inventors: Keith J. Whitlaw, Buxton (GB);
Michael P. Toben, Smithtown, NY (US);
André Egli, Richterswil (CH); Jeffrey N. Crosby, Nuneaton (GB); Craig S. Robinson, Coventry (GB)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1032 days.

(21) Appl. No.: 10/843,984

(22) Filed: May 12, 2004

(65) Prior Publication Data

US 2004/0256239 A1 Dec. 23, 2004

(51) Int. Cl.
*C25D 5/34* (2006.01)

(52) U.S. Cl. .................. 205/205; 205/210; 216/100

(58) Field of Classification Search .......... 205/80, 205/170, 182, 205, 210, 215, 252, 300; 216/39, 216/14, 17, 18, 100
See application file for complete search history.

(56) References Cited

U.S. PATENT DOCUMENTS

| | | | | |
|---|---|---|---|---|
| 3,773,628 | A * | 11/1973 | Misawa et al. | 205/122 |
| 4,959,278 | A * | 9/1990 | Shimauchi et al. | 428/642 |
| 5,221,428 | A * | 6/1993 | Ohsawa et al. | 216/14 |
| 5,294,291 | A * | 3/1994 | Akahoshi et al. | 216/12 |
| 5,965,036 | A * | 10/1999 | Maki et al. | 216/106 |
| 6,087,714 | A * | 7/2000 | Kubara et al. | 257/666 |
| 6,677,056 | B2 * | 1/2004 | Tanaka et al. | 428/646 |
| 2003/0025182 | A1 * | 2/2003 | Abys et al. | 257/666 |
| 2003/0201188 | A1 * | 10/2003 | Schetty et al. | 205/300 |

FOREIGN PATENT DOCUMENTS

| | | |
|---|---|---|
| EP | 0 346 888 B1 | 3/1994 |
| EP | 0 587 296 B1 | 3/2002 |
| EP | 1 241 281 A1 | 9/2002 |
| JP | 05033187 A * | 2/1993 |
| WO | WO 99/06612 | 2/1999 |

OTHER PUBLICATIONS

Harry J. Levinson, Principles of Lithography, 2001, The International Society for Optical Engineering, pp. 3-8.*
Whitlaw et al.; "An investigation into methods for minimizing tin whisker growth"; AESF SUR/FIN Conf.; Jun. 2003; pp. 289-298.
Whitlaw et al.; "Preventing whiskers in electrodeposited tin for semiconductor lead frame applications"; IPC Int. Conf. on Lead-Free Electronics; Jun. 2003; Retrieved from the Internet: URL:http://www.efsot-europe.info/servlet/is/251/15%20KeithWhitlaw.pdf?command=downlowadContent&filename=15%20KeithWhitlaw.pdf>.

* cited by examiner

*Primary Examiner*—Nam X Nguyen
*Assistant Examiner*—Luan V Van
(74) *Attorney, Agent, or Firm*—John J. Piskorski

(57) ABSTRACT

A method for plating tin or a tin alloy on a substrate such that whiskers are prevented form forming or the number of whickers is reduced in number as well as size.

7 Claims, 4 Drawing Sheets

TIN PLATING METHOD

BACKGROUND OF THE INVENTION

The present invention is directed to an improved tin and tin alloy plating method that inhibits whisker formation. More specifically, the method of the present invention is directed to an improved tin and tin alloy plating method that inhibits whisker formation by an etching method and employing a copper metal coating.

Metal filaments, usually called whiskers, sometimes grow spontaneously from tin, zinc, or cadmium coatings within a period after production that may vary from days to years at a rate, which may reach 1 mm/month but is usually much less. Commonly, the growths are in the form of straight or kinked single crystals of 1-2 microns (μm) in diameter and grow from their bases, but other forms have been observed.

The growths do not affect the protective quality of the coatings, however, experience has shown that whiskers are fully capable of producing damaging short circuits in electronic equipment. Although most whiskers have diameters of only 1 to 2 μm, some have been found to carry a current of 10 mA (milliamperes) before burning out. The number of instances of trouble reported or suspected has increased over the years. More knowledge observation now identifies whiskers as a cause of failure when previously their presence might not have been suspected, but causes for a real increase are closer spacings between conductors and increased use of bright tin coatings.

Early reports of failures of electronic equipment were concerned mainly with internal faults in components such as relays but instances now occur of bridging the gaps on printed circuit and wiring boards, sometimes by whiskers falling from components but also by growths from the circuit itself. This trouble has often been associated with bright deposits but growth from chemical replacement coating of tin has also been reported; their limited thickness probably makes them vulnerable. Experience has not pointed to any environmental factors as especially influential although whiskers are seen more often on components that are sealed up and undisturbed, including those kept in storage, probably because there is a lesser chance of their removal by mechanical detachment.

An example of one such electronic component that has been subject to whisker formation is the lead frame. Devices such as integrated circuits are mechanically and electrically connected to larger assemblies via lead frames. The integrated circuit or other device is mechanically mounted on the lead frame, and the device is then electrically connected to the leads on the lead frame. The lead frame is then electrically and mechanically connected to a larger assembly. After the device is mounted on the lead frame, the device is encapsulated for protection. The process for mounting and electrically interconnecting the device to the lead frame and connecting the lead frame to a larger assembly includes steps for device attachment, cure, wirebonding, encapsulation, trim-and-forming, and soldering. Some of these steps subject the metal lead frame to mechanical stress and strain, which is believed to result in the undesirable formation of whiskers. For example, when the leads of the lead frame are formed according to the industrial standard, the forming angle is from 82 to 90 degrees and the forming radius is 250 μm.

Lead frames have been formed from a variety of materials. Lead frame materials are selected for their mechanical strength, conductivity, machinability, formability, corrosion resistance, wirebondability, solderability, and thermal expansion. Although gold and palladium have the desired characteristics, the cost of these materials makes their use prohibitive for many applications. Copper and copper alloys also have many advantageous properties that make them suited for this application. A number of different copper alloys may be used including alloy 151 (99.9 wt. % copper/0.1 wt. % zirconium); alloy 194 (97.5 wt. % copper/2.35 wt. % iron/0.03 wt. % phosphorous/0.12 wt. % zinc); and alloy 7025 (96.2 wt. % copper/3.0 wt. % nickel/0.65 wt. % silicon/0.15 wt. % magnesium). However, corrosion of copper in air and the difficulty of forming suitable soldered connections to copper create a need to use coated copper lead frames. Coating of lead frames provides corrosion protection and provides suitable solderable surfaces. An example of another suitable metal alloy for a lead frame is an iron-nickel alloy such as alloy 42 (58 wt. % iron and 42 wt. % nickel). However, corrosion of this metal alloy in air also precludes the use of the uncoated alloy as a lead frame.

A suitable coating for such metal lead frames is tin or a tin alloy. However, tin or a tin alloy plated on the lead frame may form whiskers. Whisker formation is especially noticeable at points of stress and strain in the lead frames. Early literature (see S. C. Britton, *Trans. Inst. Metal Finishings*, 52, 95 (1974)) alleged that copper undercoats may reduce tin whiskering, however, recent studies (see Keith Whitlaw & Jeff Crosby, *Proceedings—AESF SUR/FIN Annual International Technical conference*, (2002) have clearly shown that copper undercoats may accelerate whisker growth substantially. In some cases tin or tin alloy deposits, which exhibit low tendency to formation of whiskers in the absence of copper undercoat, may rapidly produce high population densities of long tin whiskers when a copper undercoat is applied to a substrate. Workers in the art attribute whisker formation due to copper underlayers to copper crystal orientation of predominantly 111 (Miller Index). Predominantly means that 60% or greater of the copper crystal orientation at the deposit surface has a Miller Index of 111. Accordingly, there is a need for a method to prevent or at least reduce whisker formation on tin or tin alloy coated substrates.

SUMMARY OF THE INVENTION

The present invention is directed to a method of plating including plating a copper coating on a substrate such that the copper coating has a satin or matte finish, and plating tin or a tin alloy coating on the satin or matte copper coating.

In another embodiment, the present invention is directed to a method of plating that includes plating a satin or matte copper coating on a substrate in a copper plating bath, the copper plating bath contains one or more copper salts, one or more acids, one or more surfactants, and one or more halide ions; and plating the substrate with the satin or matte copper coating with tin or a tin alloy coating.

In a further embodiment, the present invention is directed to a method of forming an electronic component that includes applying a photosensitive compound to a metal substrate and forming an imagewise pattern on the photosensitive compound, developing the photoresist compound, etching the metal substrate, plating a satin or matte copper coating on the etched metal substrate, and coating the satin or matte copper coated substrate with tin or a tin alloy.

In an additional embodiment, the tin or tin alloy coated substrates may be annealed at a suitable temperature after anyone of the plating methods of the present invention. In addition to the plating methods, the annealing step also helps reduce or eliminate whisker formation. Elimination or reduction of whisker formation is believed to be due to copper metal coatings having a predominantly 220 crystal orientation at least at the copper deposit surface.

DETAILED DESCRIPTION OF THE INVENTION

Figure 1A:
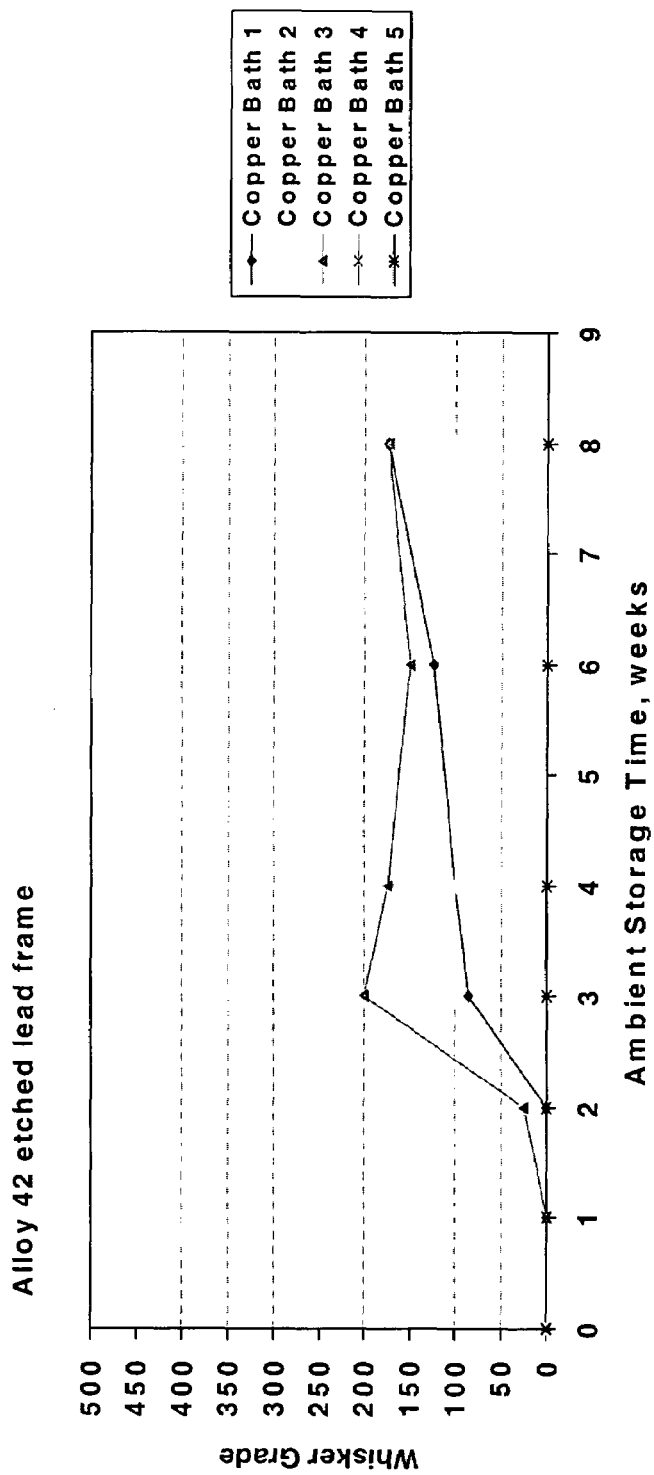
FIG. 1 illustrates two graphs of whisker grade versus ambient storage time for alloy 42 and brass etched lead frames plated with tin bath 1.

As used throughout the specification, the following abbreviations have the following meanings, unless the context clearly indicates otherwise: ° C.=degrees Centigrade; g=gram; L=liter; mL=milliliter; A=amperes; dm=decimeter; and μm=micron=micrometer; ppm=parts per million.

The terms "depositing" and "plating" are used interchangeably throughout this specification. "Underplate" and "underlayer" are used interchangeably throughout this specification. The term "underlayer", as used throughout this specification, refers to a metal layer or coating disposed between a substrate and a tin or tin alloy layer or other suitable metal or metal alloy layer. The term "matte" means a dull finish. The term "satin" means a subdued glitter approaching but short of optical reflection, such as a sheen finish that is neither dull nor bright. The term "bright" means an optical reflective finish. The terms "matte", "satin" and "bright" are well understood by those of skill in the art in reference to metal deposits. The terms "printed wiring board" and "printed circuit board" are used interchangeably throughout this specification. All amounts are percent by weight and all ratios are by weight, unless otherwise noted. All numerical ranges are inclusive and combinable in any order except where it is logical that such numerical ranges are constrained to add up to 100%.

The present invention is directed to a method of plating that includes plating a copper coating or underlayer on a substrate such that the copper coating has a satin or matte appearing surface or finish, and plating tin or a tin alloy coating on the satin or matte copper coating or underlayer. The method of the present invention may be employed to plate a copper underlayer with tin or a tin alloy coating on any suitable substrate. Typically substrates that are plated by the method of the present invention are components used in electronic devices.

Although the present invention is described in the context of a satin or matte copper metal undercoat with a tin or a tin alloy top coating, the method of the present invention may employ any metal or metal alloy as a top coat or top layer that suffers from whisker formation. Surprisingly, a satin or matte copper metal coating or underlayer on a substrate prevents or at least reduces the undesirable formation of whiskers on metals or metal alloys, which typically form whiskers over time. Such whisker elimination or reduction is believed to be due to copper underlayers having a predominantly 220 crystal orientation at the surface of the copper deposit. The term "predominantly" means that from 60% to 99% of the copper crystals or such as from 70% to 98% of the copper crystals at the surface of the copper deposit has a Miller Index of 220. Such crystal orientation may be determined using X-ray diffraction (XRD) technology and apparatus. Accordingly, a "surface" is a depth at which an X-ray beam may penetrate into a metal deposit. However, such copper crystal orientation may be expected throughout much of the copper metal deposit.

Whiskers may lead to electrical shorts in electrical devices, thus resulting in malfunctioning of the devices. Whisker formation typically occurs at points of stress and strain in metal components such as, but not limited to, lead frames. When the shape of a metal component is modified to mechanically and electrically contact another component of an electrical apparatus, the points of stress or strain may form metal crystals or whiskers of tin, tin alloy or another metal, which typically forms whiskers. Inclusion of a satin to matte copper underlayer on the substrate prevents or at least reduces the formation of whiskers, thus reducing the chances of electrical failure of an electrical device and increases the working life of the device.

Any suitable copper metal plating bath may be employed to practice the present invention provided that the copper metal deposited on the substrate provides a satin or matte surface or finish that prevents or at least reduces whisker formation on the substrate. Such a satin or matte finish is visible to the naked eye. Examples of suitable copper metal plating baths include, but are not limited to, acid copper baths. Such acid copper baths may be aqueous or have an organic diluent or the bath may be an aqueous or organic mixture. A source of copper may be any copper compound or salt of copper, which is partially or completely soluble in the diluent. Other components added to the bath may include a source of halide ions, surfactants, suppressors, carriers, levelers or mixtures thereof. Compounds that are used in copper metal plating baths for providing a bright finish on the copper metal layer or coating are excluded from the copper baths of the present invention because such compounds may encourage whisker formation. Accordingly, any compound or adjuvant may be employed in the copper metal plating baths of the present invention provided that the compound or adjuvant does not encourage whisker formation. An adjuvant within the scope of the present invention is a compound that assists or improves the copper metal deposition on a substrate, in particular, compounds that also do not encourage whisker formation. Examples of such adjuvants include, but are not limited to, suppressors, carriers, surfactants, halide ions or levelers.

Examples of suitable copper compounds, which may be employed to practice the present invention include, but are not limited to, copper halides, copper sulphates, copper alkane sulphonates, copper alkanol sulphonates, or mixtures thereof. An example of a suitable copper halide is the chloride copper halide. An example of a suitable copper sulphate is copper sulphate pentahydrate, and an example of a suitable copper alkane sulphonate is copper methane sulphonate. Copper compounds useful in the present invention are generally commercially available or may be prepared by methods known in the literature. When copper is deposited on a substrate, the copper metal plating bath may have a pH range such as 0 to 8, or a pH range such as 0 to 4, or a pH range such as 0 to 2.

A sufficient amount of one or more copper compounds may be added to the bath such that the amount of copper ions in the bath generally ranges from 0.01 g/L to 100 g/L, or from 0.1 g/L to 50 g/L. When the bath is used in a non-high speed plating process, the amount of copper ions present in the bath ranges from 0.02 g/L to 25 g/L. When the bath is used in a high speed plating process, the amount of copper ions present in the bath ranges from 1 g/L to 100 g/L, or may range from 2 g/L to 50 g/L.

Acids included in the copper metal plating baths include any suitable inorganic acid, organic acid or mixtures thereof to maintain a desired pH range. Examples of suitable organic acids include, but are not limited to, acetic acid, citric acid or mixtures thereof. Examples of suitable inorganic acids include, but are not limited to, sulphuric acid, hydrochloric acid, nitric acid, phosphoric acid, or mixtures thereof. Typically, sulphuric acid is used. Generally acids may be employed in amounts of from 100 g/L to 350 g/L, or in a range of from 150 g/L to 250 g/L.

Examples of suitable surfactants that may be employed include, but are not limited to, nonionic surfactants such as alkyl phenoxy polyethoxyethanols, polyoxyethylene polymers, ethylene oxide/propylene oxide copolymers, or mixtures thereof. Polyoxyethylene polymers employed typically have from 20 to 150 repeating units. Such surfactants also may be employed as carriers or suppressors.

An exemplary polyether surfactant that may be employed has the general formula:

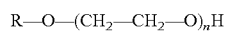

where R is an aryl or alkyl group containing from 2 to 20 carbon atoms and n is an integer between 10 and 100,000. Generally R is an ethylene group and n is greater than 12,000. Molecular weights of such polyethers range from 500,000 and greater. Surfactants are included in amounts of from 1 g/L to 10 g/L, or in amounts of from 2 g/L to 7 g/L of a copper plating bath.

Examples of high molecular weight compounds that may be employed as surfactants include, but are not limited to, carboxymethylcellulose, nonylphenolpolyglycol ether, octanediolbis-(polyalkylene glycolether), octanolpolyalkylene glycolether, oleic acidpolyglycol ester, polyethylenepropylene glycol, polyethylene glycol, polyethylene glycoldimethylether, a polyoxyalkylene glycol such as polyoxypropylene glycol, polypropylene glycol, polyvinylalcohol, stearic acidpolyglycol ester, polyethylene oxide, stearyl alcoholpolyglycol ether, or mixtures thereof. Such compounds also may be employed as carriers. In general, polyoxyalkylene glycols or polyalkylene glycols may be used. Such compounds are included in amounts of from 2 g/L to 10 g/L, or from 3 g/L to 7 g/L of a copper plating bath.

Suitable levelers include, but are not limited to, 1-(2-hydroxyethyl)-2-imidazolidinethione, 4-mercaptopyridine, 2-mercaptothiazoline, ethylene thiourea, thiourea, alkylated polyalkyleneimine or mixtures thereof. Such levelers are included in amounts of from 0.1 to 3 ppm of the bath.

Halide ions may be included in the bath in amounts of from 0 to 100 ppm, or in amounts of from 45 ppm to 75 ppm. Any suitable source of halide ions may be employed as long as the source is soluble in the bath diluent. Halides include chlorine, bromine and fluorine. Examples of such suitable salts are alkali metal salts such as sodium and potassium salts. Examples include, but are not limited to, sodium chloride and potassium chloride, or mixtures thereof.

An exemplary acid copper electroplating bath has the following composition:

| | |
|---|---|
| Copper Ions (as Copper Sulphate) | 50 to 100 g/L |
| Sulphuric Acid (Concentrated) | 100 to 250 g/L |
| Chloride Ions (as Sodium Chloride) | 50 to 150 ppm |
| Surfactants | 4 to 6 g/L |
| Water | To 1 liter |

A particularly exemplary copper metal plating bath of the present invention consists essentially of a diluent composed of water; one or more copper metal salts to provide a suitable amount of copper ions for depositing a metal on a substrate; one or more organic acids, one or more sources of halide ion such as a soluble chloride salt and one or more surfactants.

A substrate may be plated with an underplate of copper by any suitable electroplating process known in the art. The substrate to be plated is the cathode. A soluble or an insoluble anode may be employed in the electroplating apparatus. A process of pulse plating or direct current (DC) plating or a combination of DC and pulse plating may be employed. Current densities and electrode surface potentials may vary depending on the specific substrate to be plated. Generally, anode and cathode current densities may range from 1 to 50 A/dm$^2$, or from 5 to 30 A/dm$^2$. Selection of a suitable applied current density can beneficially influence the crystallographic texture of the copper layer. Copper plating baths may be maintained in a temperature range of from 20° C. to 80° C. or from 20° C. to 50° C. Plating is continued for a time sufficient to form a deposit of desired thickness. Copper underlayer thicknesses may range such as from 0.1 µm to 10 µm, or such as from 1 µm to 5 µm. An example of a suitable apparatus that may be employed is disclosed in U.S. Pat. No. 4,897,165 to Bernards et al. and assigned to Shipley Company Inc.

A tin or tin alloy coating is deposited over the satin or matte cooper underlayer. Tin alloy means any metal containing tin and one or more other alloying elements except lead, and thus includes, for example, binary alloys, or ternary alloys. Suitable alloying elements include, but are not limited to, bismuth, copper, silver, antimony, or zinc. Typically the tin alloys include bismuth, copper or silver. An exemplary tin alloy is tin-copper. Such tin-copper alloys may contain, for example, from 0.5 to 10% by weight copper, the balance being tin. Such tin-copper alloys may optionally contain minor amounts of other alloying elements. Concentrations of one or more alloying elements may vary over a wide range. The range of such alloying elements is well within the ability of one skilled in the art. Thicknesses of tin and tin alloy coatings may vary across a wide range, depending upon the particular application. For example, when a tin or tin-alloy layer is deposited on a lead frame with a copper layer, the thickness may range such as from 0.5 to 15 µm, or such as from 0.5 to 5 µm or such as from 1 to 3 µm.

Tin or tin alloy may be deposited by a variety of means such as electrolytically. Electrolytic deposition may be, for example, by direct current (DC) or pulse plating, including pulse periodic reverse plating. Choice of the deposition technique may depend, for example, upon the particular substrate and the layer to be deposited. Typically, a tin or tin alloy plating bath is at a temperature of from 20° C. to 60° C., or such as from 35° C. to 45° C. Current density for tin and tin alloy electroplating is from 1 to 50 A/dm$^2$, or such as from 5 to 30 A/dm$^2$. Selection of a suitable applied current density can beneficially influence the crystallographic texture of the tin or tin-alloy layer.

Suitable electrolytic tin and tin alloy plating baths may be acidic or alkaline. An exemplary tin electroplating bath contains one or more diluent soluble tin compounds, one or more acidic electrolytes, and optionally one or more adjuvants. Suitable tin compounds include, but are not limited to salts, such as tin halides, tin sulphates, tin alkane sulphonates such as tin methane sulphonate, tin aryl sulphonate such as tin phenyl sulphonate, tin phenol sulphonate, tin toluene sulphonate, tin alkanol sulphonate or mixtures thereof. Typically, tin sulphate, tin chloride, tin alkane sulphonate or tin aryl sulphonate are employed. More typically, tin sulphate or tin methane sulphonate are used. The amount of tin compound in the electrolyte compositions is in an amount sufficient to provide tin ions in an amount of such as from 5 to 150 g/L, or such as from 30 to 80 g/L, or such as from 40 to 60 g/L. Mixtures of tin compounds may optionally be used in the amounts described above.

Any acidic bath that is diluent soluble may be employed for producing a stable tin bath and does not otherwise adversely affect the bath composition may be used. Suitable acidic electrolytes include, but are not limited to, alkane sulphonic acids, such as methane sulphonic acid, ethane sulphonic acid and propane sulphonic acid, sulphuric acid, sulphamic acid, hydrochloric acid, hydrobromic acid, fluoroboric acid or mixtures thereof. Typically, the amount of acidic electrolyte is in the range such as from 10 to 400 g/L or from 50 to 400 g/L or from 150 to 300 g/L. Preferably, when the tin compound is a halide, the acidic electrolyte is the corresponding acid. For example, when tin chloride is used in the present invention, the acidic electrolyte preferably is hydrochloric acid.

In tin alloy plating baths one or more alloying metal compounds is used in addition to tin. Suitable other metals include, but are not limited to, nickel, copper, bismuth, zinc, silver, antimony, or indium. A particular suitable tin alloy is tin-copper. The other metal compounds useful in the present invention are any which provide the metal to the electrolyte composition in a soluble form. Thus, metal compounds include, but are not limited to, salts, such as halides, metal sulphates, metal alkane sulphonates, such as metal methane sulphonate, metal aryl sulphonates, such as metal phenyl sulphonate and metal toluene sulphonate, or metal alkanol sulphonates.

Optionally, one or more grain refiners/stabilizers may be employed in the tin or tin alloys baths. Suitable compounds include, but are not limited to, imides, imines, such as carboxymethylated polyethyleneimine, amides, polyamides, amines, such as 3-ethyl amine, polyamines, polycarboxylates, polyols, thiols, such as dibutyl thiourea, allyl thiourea, tetramethyl thiourea, thiourea, amino thiazole, rhodanine, and sulphosalicylic acid, multi-ring compounds containing carbonyl or imide functionality, such as rosolic acid, isatin, and carmine, and sulphamides, such as saccharin. Such compounds can beneficially maintain a desired tin crystal structure over a wide range of operating conditions. Such compounds may be employed in amounts of from 0.05 to 5 g/L.

Optionally, one or more adjuvants may be used in the tin or tin alloy electroplating baths, such as reducing agents, antioxidants, other grain refiners such as hydroxy aromatic compounds and other wetting agents, brightening agents, or mixtures thereof. Such adjuvants are useful, for example, in enhancing the efficiency or quality of plating.

Reducing agents may be added to the tin or tin alloy bath compositions to assist in keeping the tin in a soluble, divalent state. Suitable reducing agents include, but are not limited to, hydroquinone and hydroxylated aromatic compounds, such as resorcinol, catechol, or mixtures thereof. Suitable reducing agents are those disclosed, for example, in U.S. Pat. No. 4,871,429. Amounts of such reducing agents range from 0.1 g/L to 5 g/L.

Bright deposits of tin or tin alloy may be obtained by adding brighteners to the tin or tin alloy baths. Such brighteners are well known in the art. Suitable brighteners include, but are not limited to, aromatic aldehydes such as naphthaldehyde, benzaldehyde, allylbenzaldehyde, methoxybenzaldehyde, chlorobenzaldehyde, derivatives of aromatic aldehydes, such as benzyl acetone, benzylidine acetone, aliphatic aldehydes, such as acetaldehyde or glutaraldehyde, and acids such as acrylic acid, methacrylic acid or picolinic acid. Such brighteners are used in amounts of from 0.1 to 3 g/L or from 0.5 to 2 g/L.

Optionally, hydroxy aromatic compounds or other wetting agents may be added to the tin and tin alloy bath compositions to provide further grain refinement. Such grain refiners may be added to the bath compositions to further improve deposit appearance and operating current density range. Suitable other wetting agents include, but are not limited to, alkoxylates, such as the polyethoxylated amines JEFFAMINE T-403 or TRITON RW, or sulfated alkyl ethoxylates, such as TRITON QS-15, and gelatin or gelatin derivatives. The amounts of such grain refiners useful are well known to those skilled in the art and typically are in the range of 0.01 to 20 mL/L, or from 0.5 to 8 mL/L, or from 1 to 5 mL/L.

Tin and tin alloy baths may further include one or more alkylene oxide compounds. The one or more alkylene oxide compounds that are useful are any which yield deposits having good solderability, good matte or lustrous finish with satisfactory grain refinement, are stable in the acidic bath, electroplate at high speeds, are low foaming and proved a cloud point of the bath above 110° F. (ca 43° to 44° C.). Suitable alkylene oxide compounds include, but are not limited to, ethylene oxide/propylene oxide (EO/PO) copolymers, alkylene oxide condensation products of an organic compound having at least one hydroxy group and 20 carbon atoms or less, and compounds prepared by adding oxypropylene to polyoxyethylene glycol. Typically, the EO/PO copolymers have an average molecular weight in the range of from 500 to 10,000 Daltons or from 1000 to 5000 Daltons. The EO/PO alkylene oxide copolymer is more typically employed to practice the present invention. One or more alkylene oxide compound may be employed in the tin or tin alloy baths. They are employed in amounts such as from 0.1 g/L to 15 g/L or such as 0.5 g/L to 10 g/L.

Additional suitable non-ionic surfactants or wetting agents include, but are not limited to, relatively low molecular weight ethylene (EO) derivatives of aliphatic alcohols containing one or more alkyl groups of up to 7 carbons or ethylene oxide derivatives of aromatic alcohols having up to two aromatic rings, which may be fused and which may be sustained with an alkyl group having up to 6 carbons. The aliphatic alcohols may be saturated or unsaturated. The aromatic alcohols typically have up to 20 carbon atoms prior to derivatization with ethylene oxide. Such aliphatic and aromatic alcohols may be further substituted, for example, with sulphate or sulphonate groups. Suitable wetting agents include, but are not limited to, ethoxylated polystyrenated phenol containing 12 moles of EO, ethoxylated butanol containing 5 moles of EO, ethoxylated butanol containing 16 moles of EO, ethoxylated butanol containing 8 moles of EO, ethoxylated octanol containing 12 moles of EO, ethoxylated octylphenol containing 12 moles of EO, ethoxylated/propoxylated butanol, ethyloxylated beta-naphthol containing 13 moles of EO, ethoxylated beta-naphthol containing 10 moles of EO, ethoxylated bisphenol A containing 10 moles of EO, ethoxylated bisphenol A containing 13 moles of EO, sulfated ethoxylated bisphenol A containing 30 moles of EO, and ethoxylated bisphenol A containing 8 moles of EO. Such non-ionic surfactants or wetting agents are included in an amount such as from 0.1 to 20 g/L or such as from 0.5 to 10 g/L.

Additionally, the tin and tin alloy baths may include one or more polyalkylene glycols. Suitable polyalkylene glycols are any which are compatible with the bath composition, yield deposits having good solderability, good matte or sheen finish with satisfactory grain refinement, are stable in an acidic electroplating bath, electroplate at high speed, are low foaming, and provide a cloud point of the bath above 110° F. (ca. 43° to 44° C.). Suitable polyalkylene glycols include, but are not limited to, polyethylene glycol, and polypropylene glycol. Polyethylene glycol is more typically employed in the tin and tin alloy baths of the present invention. Such polyalkylene glycols are commercially available from a variety of sources and may be used without further purification.

Polyalkylene glycols have an average molecular weight in the range such as from 200 to 100,000 Daltons, or such as from 900 to 20,000 Daltons. The polyalkylene glycols are used in amounts of from 0.1 to 15 g/L, or from 0.25 to 10 g/L or from 0.5 to 8 g/L of the tin or tin alloy bath.

Tin and tin alloy baths also may include one or more carboxyalkylated polyalkyleneimine compounds. Carboxyalkylated polyalkyleneimine compounds refer to polyalkyleneimine compounds containing one or more carboxyalkyl substituents. A wide variety of carboxyalkylated polyalkyleneimine compounds are suitable for use in the present invention, including, but not limited to, carboxyalkylated polyethyleneimine, carboxyalkylated polypropyleneimine and carboxyalkylated polybutyleneimine. Carboxymethylated polyethyleneimines are more typically employed. Carboxyalkylated polyalkyleneimines may have molecular weights of equal to or greater than 500 Daltons, or equal to or greater than 1000 Daltons, or equal to or greater than 2500 Daltons. Particularly suitable carboxyalkylated polyalkyleneimine compounds have molecular weights such as from 1000 to 200,000 Daltons or such as from 10,000 to 150,000 Daltons. Typically, such carboxyalkylated polyalkyleneimine compounds have 10% or greater carboxyalkylation, or such as 20% or greater carboxyalkylation, or such as 30% or greater carboxyalkylation, or such as 50% or greater carboxyalkylation, or such as 75% or greater carboxyalkylation. Such compounds are commercially available, such as those sold under the TRILON tradename from BASF, Ludwigshafen Germany. Such compounds are employed in amounts such as from 0.1 to 15 g/L or such as from 1 to 10 g/L.

The carboxyalkylated polyalkyleneimine compounds may be further alkoxylated, such as by reaction with ethylene oxide, propylene oxide or both. Suitable alkoxylated carboxyalkylated polyalkyleneimine compounds are those containing up to 20 moles of ethylene oxide (EO), up to 20 moles of propylene oxide (PO), or up to 40 moles of a mixture of EO and PO. Examples of such compounds include, but are not limited to, carboxylated polyalkyleneimine compounds reacted with any of the following: 5 moles of EO; 8 moles of EO; 10 moles of EO; 12 moles of EO; 3 moles of PO; 5 moles of PO; 8 moles of PO; 10 moles of PO; 3 moles of EO and 5 moles of PO; 8 moles of EO and 5 moles of PO; 15 moles of EO and 8 moles of PO; 15 moles of EO and 12 moles of PO; or 10 moles of EO and 10 moles of PO. Such compounds are employed in amounts such as from 0.1 to 15 g/L or such as from 1 to 10 g/L.

Optionally, an antioxidant compound may be employed in the electrolyte composition to minimize or prevent stannous tin oxidation from occurring, for example, from the divalent to tetravalent state. Suitable antioxidant compounds include, for example, dihydroxybenzene and multivalent compounds based on the elements of groups IVB, VB and VIB of the Periodic Table of Elements, such as those of vanadium, niobium, tantalum, titanium, zirconium and tungsten. Such antioxidants are present in the baths in an amount of from 0 to 2 g/L.

Optional additives or adjuvants, if any, that are added to the bath compositions depend upon the results and types of deposits desired.

An exemplary tin plating bath may contain from 20 to 60 g/L of tin as tin(II) methane sulphonate, 100 to 170 g/L of free methane sulphonic acid, 20 to 50 g/L of one or more surfactants and one or more optional compounds.

Another exemplary tin plating bath may contain from 40 to 80 g/L of tin as tin(II) methane sulphonate, 30 to 60 g/L of free methane sulphonic acid, 40 to 80 g/L of one or more surfactants and from 0.5 to 5 g/L of a vanadium reducing agent.

Optionally, the substrate with the copper underlayer and the top tin or tin alloy coating may be annealed. Annealing temperatures range such as from 70° C. to 200° C. or such as from 80° C. to 150° C. Annealing time may be from 1 minute to 2 hours or such as from 5 minutes to 1 hour. Annealing may help to further reduce whisker formation.

Any suitable substrate may be employed to practice the present invention. Typically such substrates are components for electronic devices, but the method of the present invention is not limited to depositing metals and metal alloys on electronic components. Typical examples of electronic components that may be plated with the method of the present invention include, but are not limited to, lead frames and other connector components. Such substrates are typically composed of various types of metal alloys such as, but not limited to, alloy 151 (99.9 wt. % copper/0.1 wt. % zirconium), alloy 194 (97.5 wt. % copper/2.35 wt. % iron/0.03 wt. % phosphorous/0.12 wt. % zinc), alloy 7025 (96.2 wt. % copper/3.0 wt. % nickel/0.65 wt. % silicon/0.15 wt % magnesium), or alloy 42 (58 wt. % iron/42 wt. % nickel).

In another embodiment, the present invention is directed to a method of making an article or electronic component. While the method of making the article or electronic component is not limited to a lead frame, this aspect of the invention is exemplified by making a lead frame.

A suitable conductive foil, for example, a nickel-iron alloy or a copper alloy such as 194 (Olin chemical) is immersed in a photoresist composition, connected to a source of electrical potential and the photoresist bath is subjected to electrolysis to thereby deposit a uniform photoresist on all surfaces of the foil. The photoresist may be positive acting or negative acting. Electrical deposition may be carried out at any suitable temperature such as room temperature (20° C.) and at 50 to 80 volts from 10 to 30 seconds to provide a suitable photoresist coating with a desired thickness, however, such temperature and voltage ranges are not limiting to the scope of the present invention. Variations in temperature and current may be modified and are well within the knowledge of the person of skill in the art. The specific thicknesses may vary and such thicknesses are well known to those of skill in the art. The thickness of deposited photoresist layers may be measured, for example, by use of a beta backscatter instrument such as Microderm® (UPA Technology), or by use of a profilometer such as Dektak® (Sloan Technology Company).

A phototool or mask having a desired pattern is placed on the photoresist and the photoresist is exposed to actinic radiation. The photoresist coating layer then is developed with a suitable developer solution. Such developer solutions are well known in the art. The exposed alloy foil surfaces are treated with a suitable etchant. Such etchants include, but are not limited to, ferric chloride, cupric chloride, persulphate etchants or other suitable etchants. Typically, the etchant employed has an etch rate of from 0.5 μm/minute to 5 μm/minute. Such etchants that have such etch rates are persulphate etchants. Such persulphate etchants typically contain persulphate as sodium persulphate, potassium persulphate, lithium persulphate, ammonium persulphate, or mixtures thereof. Substrates may be etched to depths of at least 0.5 microns, or to depths such as at least 1 micron, or to depths of 0.75 to 4 microns or from 1 to 3.5 microns. After etching the photoresist patterns are then stripped with an acidic stripper solution by conventional techniques from the resulting etched lead frame. Any suitable stripper may be employed. Numerous strippers are well known in the art.

To achieve a uniform and otherwise acceptable metal deposit on the lead frame, the lead frame is cleaned with an alkaline composition to remove essentially all traces of organic substances, i.e. the photoresist or any other substance that may remain after treatment with the developer solution or stripper. Any suitable alkaline solution may be employed that has a pH range of from 8 to 14.

After the etching method described above the lead frame is plated with a copper underplate followed by plating tin or a tin alloy according to the methods of the present invention. Optionally, the plated lead frame may be annealed according to the method described above.

The present invention is suitable for depositing a tin or tin alloy on an electronic device substrate having a satin to matte copper metal undercoat. Suitable electronic device substrates include, but are not limited to, printed wiring boards, lead frames, semiconductor packages, components, connectors, contacts, chip capacitors, or chip resistors. The present invention further provides an electronic device including a copper underlayer that has predominantly 220 crystal orientation. Such copper crystal orientation prevents or reduces whisker formation, thus providing an improved electronic device.

The following examples further illustrate the present invention, but are not intended to limit the scope of the invention.

Example I

Preparation of Tin Plating Baths

An aqueous tin plating bath (Tin Bath 1) was prepared by combining 50 g/L tin as tin(II) methane sulphonate, 160 g/L free methane sulphonic acid, 25 g/L ethoxylated beta-naphthol containing 8 moles of EO, 5 g/L ethoxylated bisphenol A, 5 g/L carboxymethylated polyethyleneimine, and 1 g/L hydroquinone sulphonic acid.

A second aqueous tin plating bath (Tin Bath 2) was prepared by combining 55 g/L tin as tin(II) methane sulphonate, 200 g/L free methane sulphonic acid, 4 g/L ethoxylated bisphenol A, 0.8 g/L methyl oxirane copolymer, 20 ppm morin monohydrate and 1 g/L hydroquinone sulphonic acid.

Example II

Preparation of Copper Plating Baths

An aqueous copper plating bath (Copper Bath 1) was prepared by combining 75 g/L copper sulphate pentahydrate, 220 g/L sulphuric acid, a sufficient amount of sodium chloride to provide 50 ppm of chloride ions, 1 g/L polyethylene glycol (MW=14000), 0.5 g/L polypropylene glycol (MW=425), 0.6 ppm bis(sodium sulphopropyl) disulphide and 6 ppm sodium salt of naphthalene 1,3,6-trissulphonic acid.

An aqueous copper plating bath (Copper Bath 2) was prepared by combining 75 g/L copper sulphate pentahydrate, 200 g/L sulphuric acid, a sufficient amount of sodium chloride to provide 50 ppm of chloride ions, 2 g/L Macol® 660, 1 g/L aldehyde/ethoxylated surfactant mixture and 4 ppm methyl violet dye.

An aqueous copper plating bath (Copper Bath 3) was prepared by combining 75 g/L copper sulphate pentahydrate, 180 g/L sulphuric acid, a sufficient amount of sodium chloride to provide 70 ppm of chloride ions, 0.3 g/L polyethylene glycol (MW=14000), and 25 ppm of the reaction products of tetramethyl thiocarbonic diamide with 1,2-oxathiolane 2,2 dioxide.

An aqueous copper plating bath (Copper Bath 4) was prepared by combining 110 g/L copper sulphate pentahydrate, 220 g/L sulphuric acid, a sufficient amount of sodium chloride to provide 100 ppm of chloride ions, 3 g/L polyethylene glycol (MW=14000) and 3 g/L polyoxyalkylene glycol.

An aqueous copper plating bath (Copper Bath 5) was prepared by combining 30 g/L cuprous cyanide, 50 g/L potassium cyanide, 20 g/L potassium carbonate, 8 g/L sodium gluconate, 2 g/L sodium nitrate, and a sufficient amount of potassium selenocyanide to provide 2.5 ppm of selenium.

Example III

Comparative Test

Brass (70% copper and 30% zinc) and Alloy 42 lead frames were coated with 5 micron copper layers from the five different plating baths disclosed in Example II above. Each lead frame was treated with an alkaline solution, rinsed with deionized water, then dipped in 10% sulphuric acid and rinsed with deionized water. Each lead frame was plated with a 5 micron coating of copper at a current density of 3 A/dm$^2$ using direct current in a liter volume of one of the copper plating baths.

Figure 1B:
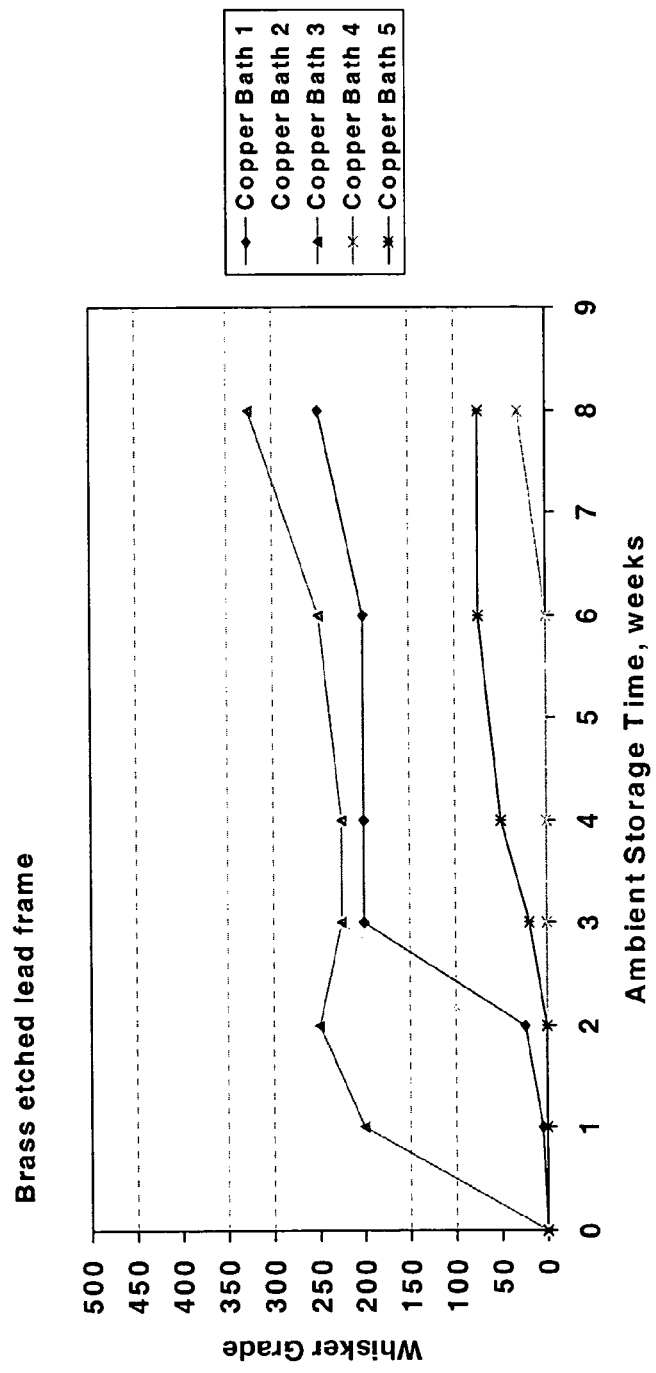
Figure 2A:
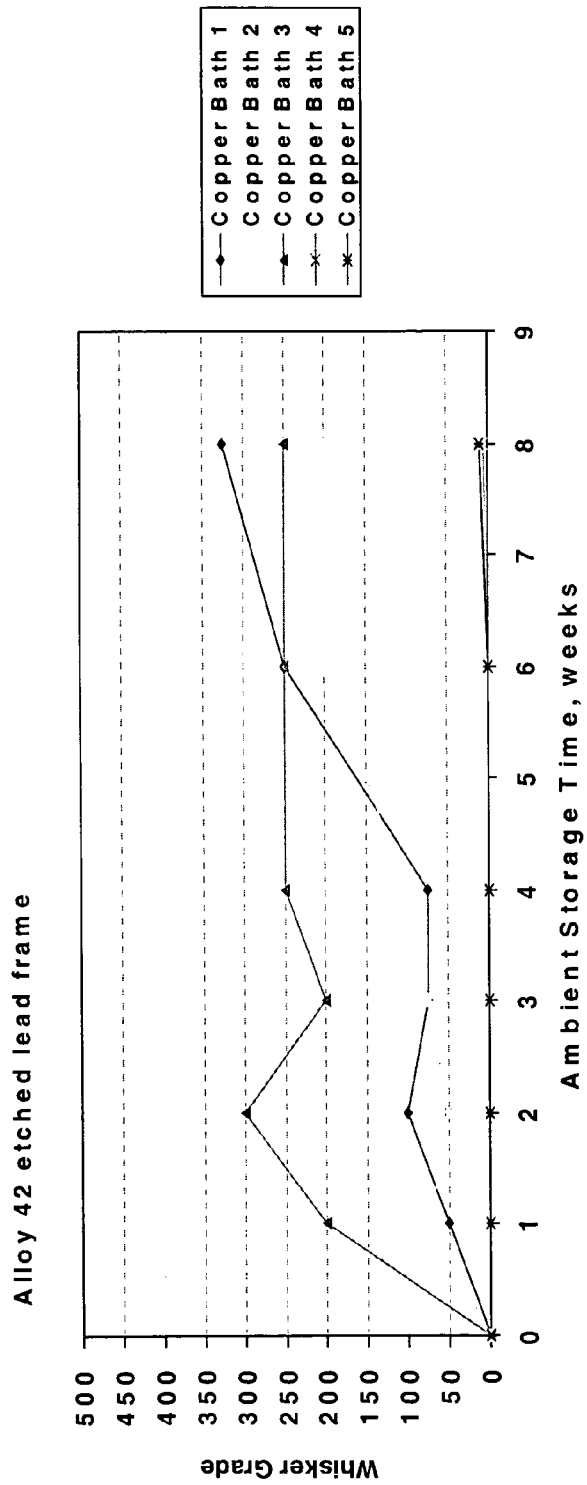
FIG. 2 illustrates graphs of whisker grade versus ambient storage time for alloy 42 and brass etched lead frames plated with tin bath 2.
Figure 2B:
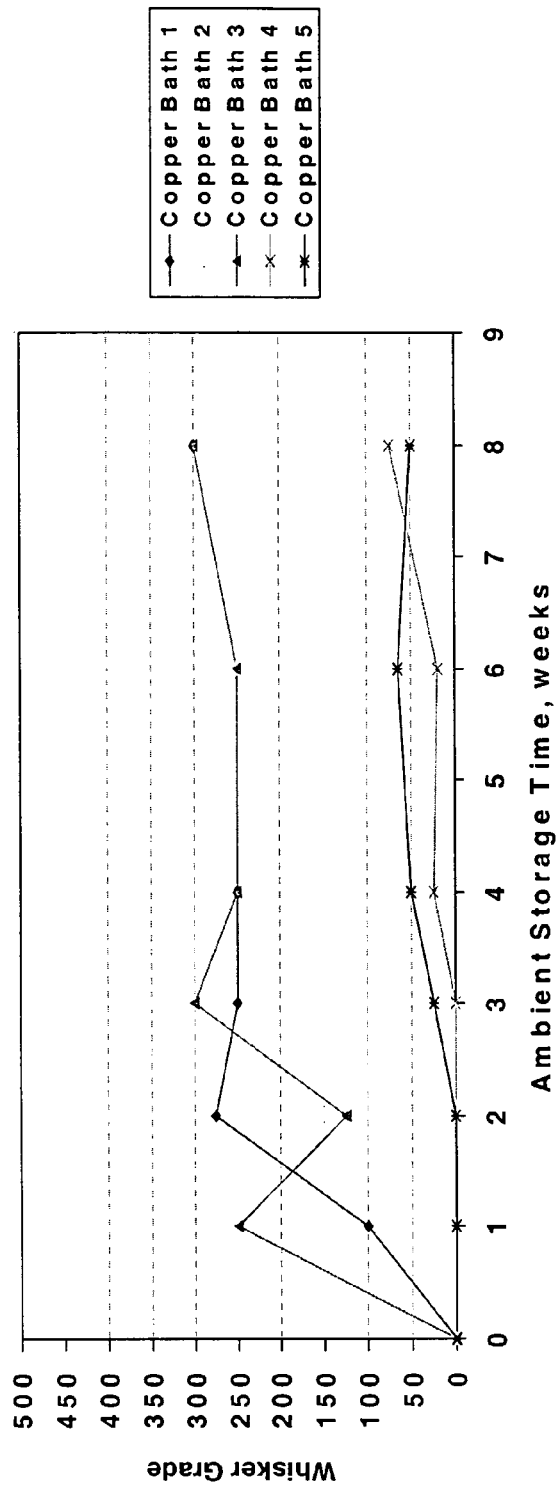

After each lead frame was plated with a copper underlayer a 3 microns top layer of tin was plated on the lead frames from one of the two tin plating baths in Example I. The current density was 10 A/dm$^2$ using direct current plating in a liter volume of one of the two tin baths. Each of the lead frame samples were examined by optical microscopy at 200× magnification in the as-plated condition and then again at intervals over a period of 8 weeks. The rate of whisker formation was assessed by counting the number of whiskers or incipient whiskers over a similar area for each sample. The results of this investigation are summarized in the table below and the graphs in FIGS. 1 and 2.

| | | | WHISKER COUNT | | | | | | |
|---|---|---|---|---|---|---|---|---|---|
| Tin Layer | Cu Barrier | Substrate | Week 0 | Week 1 | Week 2 | Week 3 | Week 4 | Week 6 | Week 8 |
| Tin Bath 1 | Copper Bath 1 | Alloy 42 | 0 | 0 | 0 | 85 | 100 | 125 | 175 |
| Tin Bath 1 | Copper Bath 2 | Alloy 42 | 0 | 25 | 25 | 100 | 100 | 100 | 100 |
| Tin Bath 1 | Copper Bath 3 | Alloy 42 | 0 | 0 | 25 | 200 | 175 | 150 | 175 |
| Tin Bath 1 | Copper Bath 4 | Alloy 42 | 0 | 0 | 0 | 0 | 0 | 0 | 0 |
| Tin Bath 1 | Copper Bath 5 | Alloy 42 | 0 | 0 | 0 | 0 | 0 | 0 | 0 |
| Tin Bath 1 | Copper Bath 1 | Brass | 0 | 5 | 25 | 200 | 200 | 200 | 250 |
| Tin Bath 1 | Copper Bath 2 | Brass | 0 | 50 | 75 | 225 | 225 | 250 | 275 |
| Tin Bath 1 | Copper Bath 3 | Brass | 0 | 200 | 250 | 225 | 225 | 250 | 325 |
| Tin Bath 1 | Copper Bath 4 | Brass | 0 | 0 | 0 | 0 | 0 | 0 | 30 |
| Tin Bath 1 | Copper Bath 5 | Brass | 0 | 0 | 0 | 20 | 50 | 75 | 75 |

-continued

| Tin Layer | Cu Barrier | Substrate | WHISKER COUNT | | | | | | |
|---|---|---|---|---|---|---|---|---|---|
| | | | Week 0 | Week 1 | Week 2 | Week 3 | Week 4 | Week 6 | Week 8 |
| Tin Bath 2 | Copper Bath 1 | Alloy 42 | 0 | 50 | 100 | 75 | 75 | 250 | 325 |
| Tin Bath 2 | Copper Bath 2 | Alloy 42 | 0 | 75 | 50 | 75 | 100 | 200 | 200 |
| Tin Bath 2 | Copper Bath 3 | Alloy 42 | 0 | 200 | 300 | 200 | 250 | 250 | 250 |
| Tin Bath 2 | Copper Bath 4 | Alloy 42 | 0 | 0 | 0 | 0 | 0 | 0 | 5 |
| Tin Bath 2 | Copper Bath 5 | Alloy 42 | 0 | 0 | 0 | 0 | 0 | 0 | 10 |
| Tin Bath 2 | Copper Bath 1 | Brass | 0 | 100 | 275 | 250 | 250 | 250 | 300 |
| Tin Bath 2 | Copper Bath 2 | Brass | 0 | 175 | 400 | 350 | 275 | 250 | 225 |
| Tin Bath 2 | Copper Bath 3 | Brass | 0 | 250 | 125 | 300 | 250 | 250 | 300 |
| Tin Bath 2 | Copper Bath 4 | Brass | 0 | 0 | 0 | 0 | 25 | 20 | 75 |
| Tin Bath 2 | Copper Bath 5 | Brass | 0 | 0 | 0 | 25 | 50 | 65 | 50 |

The best results were achieved using copper plating baths 4 and 5. Both baths were within the scope of the present invention. Further, both baths 4 and 5 produced copper underlayers with copper crystal orientations of predominantly 220. The remaining copper plating baths showed significantly more whisker formation over the 8 week period. Such copper plating baths contained brightener components and were outside the scope of the present invention. Further, copper baths 1-3 did not produce copper underlayers having a copper crystal orientation of predominantly 220.

Example IV

Effect of Etch Depth on Whiskering

An Olin 194 substrate was etched in a pre-treatment process with an etching composition of the present invention to determine the effect of etching on whisker growth on the substrate. Four samples were tested. Each Olin 194 substrate was first etched with an etching composition to depths of 0.5, 1.0 or 3.5 microns. One sample acted as a control and was not etched. After etching was completed all of the substrates were plated with a tin layer of 3 microns in an aqueous tin electrolyte bath at a current density of 20 A/dm². The tin deposits had a high proportion of critical angles as determined by X-ray defraction analysis. After plating each substrate with a tin layer, each substrate was stored for 7 months under ambient conditions.

After the period of storage, the length of the longest whisker on each substrate was counted. The results are disclosed in the table below.

| ETCH DEPTH, microns | Length of Longest Whisker, microns |
|---|---|
| 0 | 30 |
| 0.5 | 60 |
| 1.0 | 35 |
| 3.5 | <5 |

The results showed that deeper etching of a substrate in a pretreatment step prior to tin plating reduced the length of whiskers that formed on a substrate.

What is claimed is:

1. A method of forming an article comprising:
   a) providing a metal alloy substrate;
   b) coating the metal alloy substrate with a photoresist;
   c) exposing the photoresist to actinic radiation to form a pattern on the photosensitive compound;
   d) developing the exposed photoresist to expose a pattern of the metal alloy substrate;
   e) etching the exposed metal alloy substrate to a depth of 0.75 microns to 4 microns with a persulfate compound to inhibit whisker formation;
   f) stripping remaining photoresist from the metal alloy substrate to form a patterned metal alloy substrate; and
   g) depositing a tin or tin alloy coating on the metal alloy substrate to form the article.

2. The method of claim 1, wherein the dept of etching is from 1 to 3.5 microns.

3. The method of claim 1, wherein the article comprises a wiring board, lead frame, semiconductor package, contacts, chip capacitors, or chip resistors.

4. The method of claim 1, wherein an etch rate is from 0.5 µm/minute to 5 µm/minute.

5. A method of forming an article comprising:
   a) providing a metal alloy substrate;
   b) coating the metal alloy substrate with a photoresist;
   c) selectively exposing the photoresist to actinic radiation to form a pattern on the photoresist;
   d) developing the exposed photoresist to expose a pattern of the metal alloy substrate;
   e) etching the exposed metal alloy substrate to a depth of 0.75 microns to 4 microns with a persulfate compound to inhibit whisker formation;
   f) stripping remaining photoresist from the metal alloy substrate to form a patterned metal alloy substrate;
   g) depositing a satin or matte copper coating on the patterned metal substrate; and
   h) depositing a tin or tin alloy on the satin or mane copper coating to form the article.

6. The method of claim 5, further comprising annealing the satin or matte copper coating and the tin or tin alloy.

7. The method of claim 6, wherein annealing temperatures range from 70° C. to 200° C.

* * * * *